(12) United States Patent
Park et al.

(10) Patent No.: US 11,495,770 B2
(45) Date of Patent: Nov. 8, 2022

(54) DISPLAY APPARATUS

(71) Applicant: Samsung Display Co., Ltd., Yongin-si (KR)

(72) Inventors: Changmin Park, Yongin-si (KR); Sangwol Lee, Yongin-si (KR); Junmo Ji, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 147 days.

(21) Appl. No.: 17/117,903

(22) Filed: Dec. 10, 2020

(65) Prior Publication Data

US 2021/0376284 A1 Dec. 2, 2021

(30) Foreign Application Priority Data

May 27, 2020 (KR) .................. 10-2020-0063891

(51) Int. Cl.
*H01L 51/52* (2006.01)
*H01L 27/32* (2006.01)
(52) U.S. Cl.
CPC ...... *H01L 51/5237* (2013.01); *H01L 27/3244* (2013.01); *H01L 2251/5338* (2013.01)
(58) Field of Classification Search
None
See application file for complete search history.

(56) References Cited

U.S. PATENT DOCUMENTS

| 10,571,961 B2 | 2/2020 | Lee et al. |
| 2019/0058150 A1 | 2/2019 | Lee |
| 2019/0252475 A1 | 8/2019 | Sung et al. |
| 2020/0004295 A1 | 1/2020 | Paek et al. |

FOREIGN PATENT DOCUMENTS

| CN | 110114779 A | 8/2019 |
| EP | 3 328 039 A1 | 5/2018 |
| EP | 3 661 173 A1 | 6/2020 |
| KR | 10-2019-0020255 A | 2/2019 |
| KR | 10-2019-0071177 A | 6/2019 |
| KR | 10-2019-0098703 A | 8/2019 |
| KR | 10-2020-0002576 A | 1/2020 |
| WO | WO 2021/073246 A1 | 4/2021 |

OTHER PUBLICATIONS

Extended European Search Report from corresponding European Patent Application No. 21169317.1, European Search Report dated Oct. 6, 2021 (11 pgs.).

*Primary Examiner* — Vip Patel
(74) *Attorney, Agent, or Firm* — Lewis Roca Rothgerber Christie LLP

(57) ABSTRACT

A display apparatus capable of reducing a defect occurrence rate includes a display panel, a metal plate including an opening and located under the display panel to contact a lower surface of the display panel to support the display panel, and a filling layer filling the opening and including a material different from a material of the metal plate.

28 Claims, 13 Drawing Sheets

DISPLAY APPARATUS

CROSS-REFERENCE TO RELATED APPLICATION

This application claims priority to and the benefit of Korean Patent Application No. 10-2020-0063891, filed on May 27, 2020 in the Korean Intellectual Property Office, the entire disclosure of which is incorporated by reference herein.

BACKGROUND

1. Field

Aspects of one or more embodiments relate to a display apparatus.

2. Description of Related Art

A display apparatus includes a display panel. Moreover, the display apparatus may include various components in addition to the display panel. Thus, it is necessary to prevent a defect from occurring due to the mutual position relationship or coupling relationship of various components including the display panel.

However, such a display apparatus of the related art has a problem in that a defect may easily occur due to the interaction of various components.

SUMMARY

According to an aspect of one or more embodiments of the present disclosure, a display apparatus capable of reducing a defect occurrence rate is provided. However, this aspect is merely provided as an example, and the scope of the present disclosure is not limited thereto.

Additional aspects will be set forth, in part, in the description which follows and, in part, will be apparent from the description, or may be learned by practice of the presented embodiments.

According to one or more embodiments, a display apparatus includes a display panel, a metal plate including an opening and located under the display panel to contact a lower surface of the display panel to support the display panel, and a filling layer filling the opening and including a material different from a material of the metal plate.

The filling layer may include a polymer resin.

The filling layer may include a material configured to transmit electromagnetic waves.

The display apparatus may further include a sensor located under the metal plate to correspond to the filling layer.

An inner surface of the opening may include a bent surface.

A first cross-sectional area of the opening at an upper surface of the metal plate facing the display panel may be larger than a second cross-sectional area of the opening at a lower surface of the metal plate.

A first cross-sectional area of the opening at an upper surface of the metal plate facing the display panel may be smaller than a second cross-sectional area of the opening at a lower surface of the metal plate.

A first cross-sectional area of the opening at an upper surface of the metal plate facing the display panel and a second cross-sectional area of the opening at a lower surface of the metal plate may be larger than a third cross-sectional area of the opening at a central portion between the upper surface and the lower surface of the metal plate.

A first cross-sectional area of the opening at an upper surface of the metal plate facing the display panel and a second cross-sectional area of the opening at a lower surface of the metal plate may be smaller than a third cross-sectional area of the opening at a central portion between the upper surface and the lower surface of the metal plate.

The filling layer may protrude outside a lower surface of the metal plate in a direction away from the display panel.

The filling layer may include a flange portion located on the lower surface of the metal plate.

The display apparatus may further include a bracket including a main plate located under the metal plate and a side plate connected to the main plate to cover a side surface of the metal plate and a side surface of the display panel.

The display apparatus may further include a shock mitigating member connected to the metal plate and arranged between the side surface of the metal plate and the side plate.

The shock mitigating member may include a same material as that of the filling layer.

An outer surface of the shock mitigating member in a direction toward the side plate may be located outside the display panel when viewed in a direction perpendicular to an upper surface of the display panel.

The side surface of the metal plate may include a bent surface.

An area of an upper surface of the shock mitigating member facing the display panel may be larger than an area of a lower surface of the shock mitigating member.

An area of an upper surface of the shock mitigating member facing the display panel may be smaller than an area of a lower surface of the shock mitigating member.

An area of an upper surface of the shock mitigating member facing the display panel and an area of a lower surface of the shock mitigating member may be larger than a cross-sectional area of a cross-section parallel to the upper surface of the shock mitigating member at a central portion between the upper surface and the lower surface of the shock mitigating member.

An area of an upper surface of the shock mitigating member facing the display panel and an area of a lower surface of the shock mitigating member may be smaller than a cross-sectional area of a cross-section parallel to the upper surface of the shock mitigating member at a central portion between the upper surface and the lower surface of the shock mitigating member.

The shock mitigating member may protrude outside a lower surface of the metal plate in direction away from the display panel.

The shock mitigating member may include a flange portion located on the lower surface of the metal plate.

The display apparatus may further include a step mitigating layer located on an upper surface of the metal plate facing the display panel to cover a boundary between the metal plate and the filling layer.

The step mitigating layer may include a plurality of layers.

The step mitigating layer may include a thin metal layer and an invisible fingerprint (IF) coating layer.

The step mitigating layer may include an inorganic layer, an invisible fingerprint (IF) coating layer, and a thin metal layer.

The inorganic layer may be located on the upper surface of the metal plate facing the display panel to cover the boundary between the metal plate and the filling layer.

The thin metal layer may include aluminum.

A distance between an upper surface of the filling layer facing the display panel and a lower surface of the display panel may be greater than a distance between an upper surface of the metal plate facing the display panel and the lower surface of the display panel, and the display apparatus may further include an additional filling layer located between the upper surface of the filling layer and the lower surface of the display panel.

An upper surface of the additional filling layer facing the display panel may be located on a same plane as the upper surface of the metal plate facing the display panel.

Other aspects and features of embodiments of the present disclosure will become apparent from the following detailed description, the appended claims, and the accompanying drawings.

BRIEF DESCRIPTION OF THE DRAWINGS

The above and other aspects and features of one or more embodiments will be more apparent from the following description taken in conjunction with the accompanying drawings, in which.

DETAILED DESCRIPTION

Figure 1:
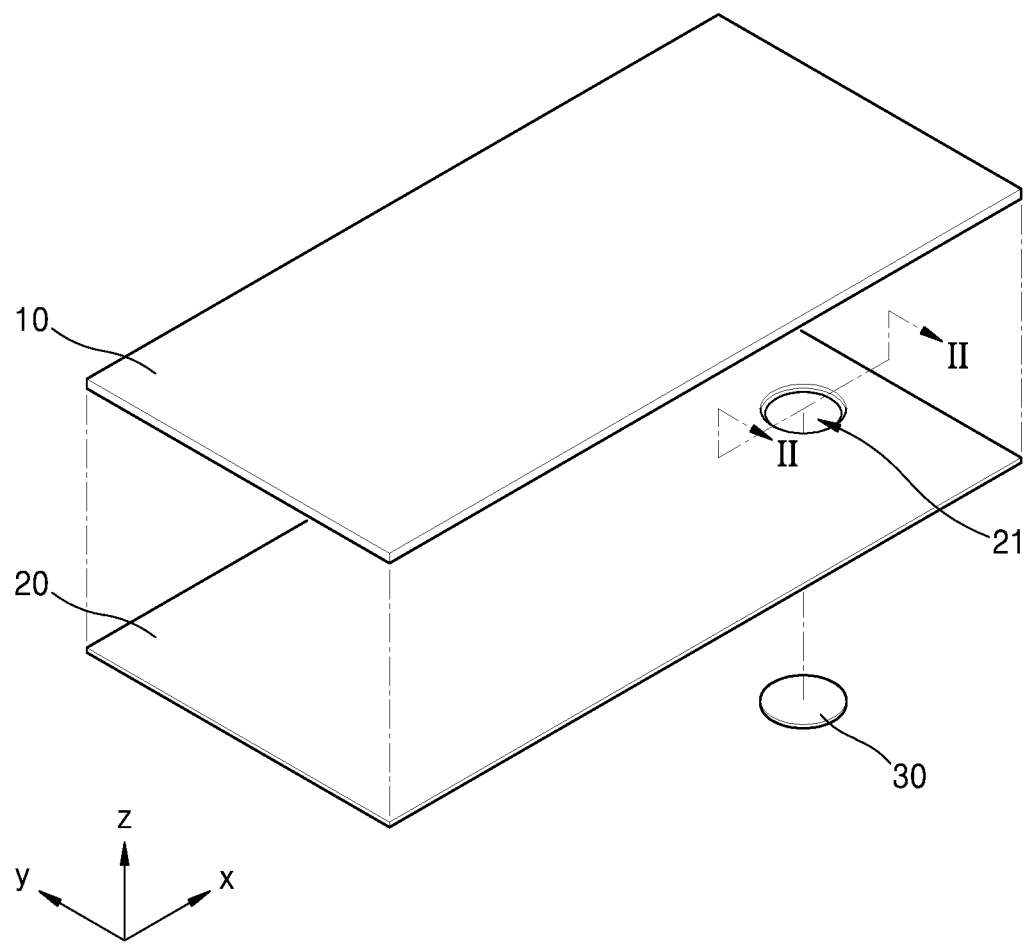
FIG. 1 is an exploded perspective view schematically illustrating a portion of a display apparatus according to an embodiment.

Reference will now be made in further detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in further detail. Aspects, effects, and features of the disclosure and the accomplishing methods thereof will become apparent from the embodiments described below in further detail with reference to the accompanying drawings. However, the disclosure is not limited to the embodiments described below and may be embodied in various modes.

Herein, embodiments will be described in further detail with reference to the accompanying drawings, and, in the following description, like reference numerals will denote like elements, and redundant descriptions thereof may be omitted for conciseness.

It is to be understood that when a component, such as a layer, a region, or a plate is referred to as being "on" another component, it may be directly on the component or may be indirectly on the other component with one or more intervening components therebetween. Also, sizes of components in the drawings may be exaggerated for convenience of description. In other words, because the sizes and thicknesses of components in the drawings may be arbitrarily illustrated for convenience of description, the disclosure is not limited thereto.

Also, herein, the x axis, the y axis, and the z axis are not limited to three axes of a rectangular coordinate system and may be interpreted in a broader sense. For example, the x axis, the y axis, and the z axis may be perpendicular to one another or may represent different directions that are not perpendicular to one another.

The terminology used herein is for the purpose of describing particular embodiments and is not intended to be limiting of the disclosure. As used herein, the singular forms are intended to include the plural forms as well, unless the context clearly indicates otherwise. It is to be further understood that the terms "comprise" or "include" and/or "comprising" or "including," when used in this specification, specify the presence of stated features, numbers, steps, operations, elements, and/or components, but do not preclude the presence or addition of one or more other features, numbers, steps, operations, elements, components, and/or groups thereof.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the element or feature in the figures is turned over, elements described as "below" or "beneath" other elements or features would then be oriented "on" or "above" the other elements or features. Thus, for example, the term "below" can encompass both an orientation of above and below.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and are expressly defined herein unless they are interpreted in an ideal or overly formal sense.

Figure 2:
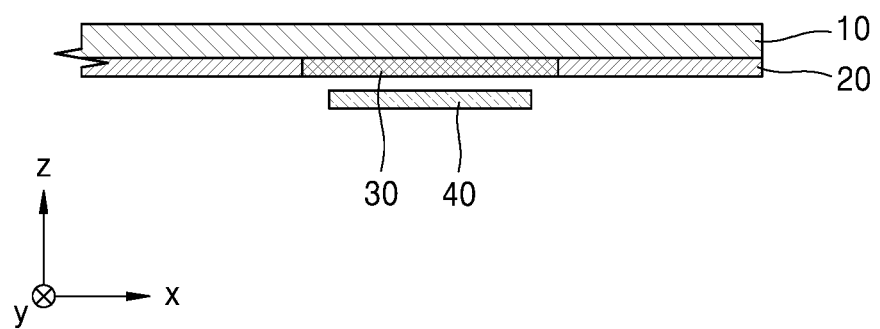
FIG. 2 is a cross-sectional view schematically illustrating a cross-section taken along the line II-II of FIG. 1.

FIG. 1 is an exploded perspective view schematically illustrating a portion of a display apparatus according to an embodiment; and FIG. 2 is a cross-sectional view schematically illustrating a cross-section taken along the line II-II of FIG. 1. As illustrated in FIGS. 1 and 2, the display apparatus according to the present embodiment may include a display panel 10, a metal plate 20, and a filling layer 30.

In an embodiment, the display panel 10 may include a substrate having flexible or bendable characteristics and display elements arranged on the substrate. In an embodiment, the substrate may include a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate.

However, the substrate may be modified in various ways, such as including a multilayer structure including two layers including a polymer resin and a barrier layer located between the two layers and including an inorganic material. In an embodiment, the barrier layer may include silicon oxide, silicon nitride, and/or silicon oxynitride.

The display element may be, for example, an organic light emitting diode (OLED). However, in addition to the display element, a thin film transistor, a capacitor, or the like, electrically connected to the display element to control the display element may be located on the substrate. In an embodiment, the display panel may also include a protection layer that is a stack structure including a first inorganic layer, an organic layer, and a second organic layer covering the display elements to protect the display elements.

The metal plate 20 may be located under (in the -z direction) the display panel 10 and contact the lower surface (in the -z direction) of the display panel 10. The metal plate 20 may support the display panel 10. In an embodiment, the metal plate 20 is thin and includes metal, and the metal plate 20 may be bent together with the display panel 10 supported by the metal plate 20 and may be restored to a flat state together with the display panel 10 after being bent. In an embodiment, the metal plate 20 may include a titanium alloy, an aluminum alloy, or SUS that is stainless steel with enhanced corrosion resistance.

As such, the display apparatus according to the present embodiment may also include the metal plate 20 as well as the display panel 10. Accordingly, it may be possible to prevent or substantially prevent the display panel 10 from being damaged due to an internal stress generated in the process of folding or unfolding the bendable or flexible display panel 10 or due to an external stress caused by an external impact or the like.

In an embodiment, the display apparatus may further include a sensor 40 located under (in the -z direction) the metal plate 20. In an embodiment, the sensor 40 may be an infrared sensor that may be used as a proximity sensor, an illuminance sensor that may sense an amount of ambient light, or an ultrasonic fingerprint sensor. In an embodiment, because the sensor 40 operates in such a way to sense an electromagnetic wave incident on the sensor 40 through the display panel 10, when the metal plate 20 incapable of transmitting an electromagnetic wave is located in front of (in the +z direction) the sensor 40, the sensor 40 may not operate properly. Thus, the metal plate 20 may include an opening 21, and the sensor 40 may be located to correspond to the opening 21 of the metal plate 20. Herein, the sensor 40 corresponding to the opening 21 of the metal plate 20 may include a configuration in which the opening 21 of the metal plate 20 and the sensor 40 overlap each other when the metal plate 20 is viewed on the upper surface of the metal plate 20 in the direction of the display panel 10. The upper surface of the metal plate 20 faces the display panel 10.

Figure 3:
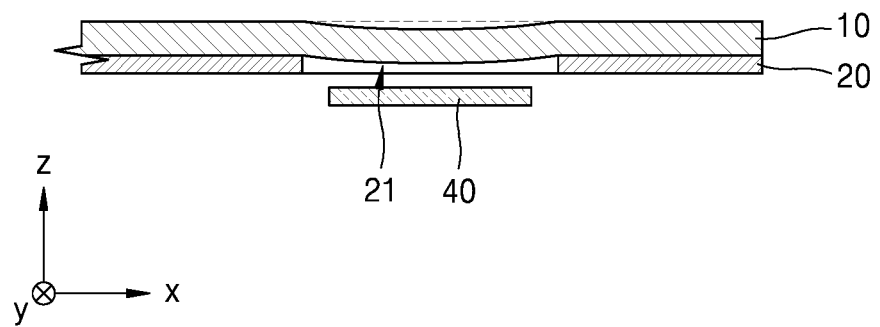
FIG. 3 is a cross-sectional view schematically illustrating a portion of a display apparatus according to a comparative example.

FIG. 3 is a cross-sectional view schematically illustrating a portion of a display apparatus according to a comparative example. In a process of manufacturing the display apparatus or in a process of using the display apparatus after the manufacture thereof, a portion of the display panel 10 corresponding to the opening 21 of the metal plate 20 may be bent into the opening 21 as illustrated in FIG. 3. Particularly, because the display panel 10 has bendable or flexible characteristics, a portion of the display panel 10 corresponding to the opening 21 of the metal plate 20 may be bent as such. In this case, when the display panel 10 is viewed in the direction perpendicular to the upper surface (in the +z direction) of the display panel 10, a portion of the display panel 10 deformed into the shape corresponding to the opening 21 of the metal plate 20 may be visible to the user.

As illustrated in FIGS. 1 and 2, the display apparatus according to an embodiment of the present disclosure may include a filling layer 30 to prevent or substantially prevent this problem from occurring. The filling layer 30 may fill the opening 21 of the metal plate 20 and may include a material different from a material of the metal plate 20. Because the filling layer 30 fills the opening 21 of the metal plate 20, it may be possible to effectively prevent or substantially prevent a portion of the display panel 10 corresponding to the opening 21 of the metal plate 20 from being bent into the opening 21 of the metal plate 20 in the process of manufacturing the display apparatus or in the process of using the display apparatus after the manufacture thereof.

The sensor 40 may be located under (in the −z direction) the metal plate 20 to correspond to the filling layer 30. In an embodiment, because the sensor 40 operates in such a way to sense an electromagnetic wave incident on the sensor 40 through the display panel 10, the filling layer 30 may include a material configured to transmit an electromagnetic wave. As such, in an embodiment, the filling layer 30 may include a non-metal material. For example, the filling layer 30 may include a polymer resin.

Examples of the polymer resin included in the filling layer 30 may include polyethersulfone, polyacrylate, polyetherimide, polyethylene naphthalate, polyethylene terephthalate, polyphenylene sulfide, polyarylate, polyimide, polycarbonate, or cellulose acetate propionate.

The filling layer 30 may be formed by any of various methods. For example, the filling layer 30 may be formed by dotting such a polymer resin forming material in the opening 21 of the metal plate 20 or by using an injection method. In the case of the injection method, the method may include a process of locating the metal plate 20 in a mold having an internal space for injection molding, injecting a polymer resin forming material into the internal space of the mold to fill the opening 21 of the metal plate 20, and then discharging the metal plate 20 from the mold.

For example, when the metal plate 20 is located in the mold for injection molding, the upper surface and the lower surface of the metal plate 20 may surface-contact the inner surface of the mold such that only the opening 21 of the metal plate 20 may become an empty space in the mold in the state in which the metal plate 20 is located in the mold. In this case, because a gate that is a path through which an injection molding material is injected into the mold is located at a position corresponding to the opening 21 of the metal plate 20, the filling layer 30 filling the opening 21 of the metal plate 20 may be formed by an injection molding method as illustrated in FIG. 2. However, when the metal plate 20 is located in the mold for injection molding, an empty space may exist in the mold in addition to the opening 21 of the metal plate 20 such that the filling layer 30 of various types may be formed. Herein, a shape of the filling layer 30 will be described.

Figure 4:
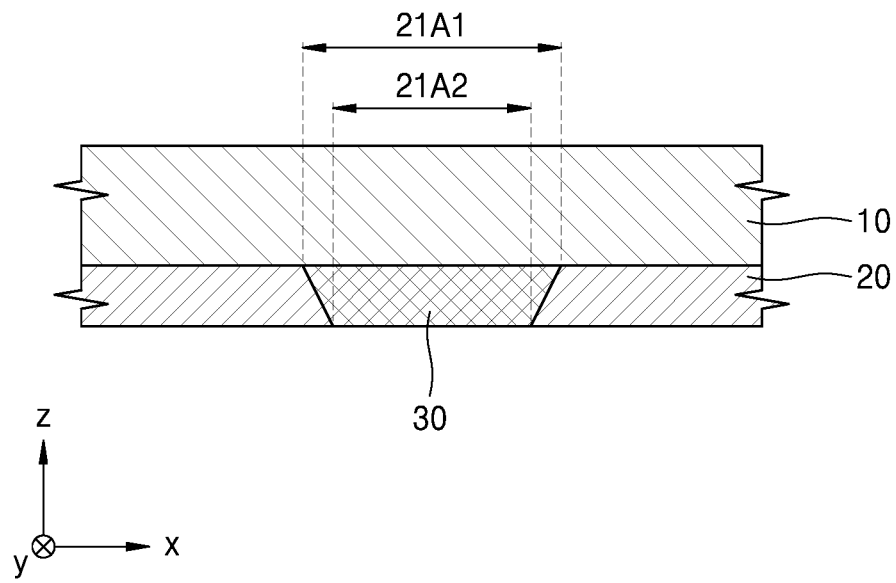
FIG. 4 is a cross-sectional view schematically illustrating a portion of a display apparatus according to another embodiment.

FIG. 4 is a cross-sectional view schematically illustrating a portion of a display apparatus according to an embodiment. As illustrated in FIG. 4, a first cross-sectional area 21A1 of the opening 21 at the upper surface (in the +z direction) of the metal plate 20 in the direction of the display panel 10 may be larger than a second cross-sectional area 21A2 of the opening 21 at the lower surface (in the -z direction) of the metal plate 20. The upper surface (in the +z direction) of the metal plate 20 faces the display panel 10. Accordingly, it may be possible to effectively prevent or substantially prevent the filling layer 30 from deviating from the opening 21 of the metal plate 20. That is, when the filling layer 30 deviates from the opening 21 of the metal plate 20, a portion of the display panel 10 corresponding to the opening 21 of the metal plate 20 may be bent into the opening 21 of the metal plate 20.

Moreover, depending on the type or use of the display apparatus, the filling layer 30 may move toward the display panel 10 away from the opening 21 of the metal plate 20 to apply a stress to the display panel 10. In this case, the display panel 10 may be bent such that a portion of the display panel 10 corresponding to the filling layer 30 may protrude upward (in the +z direction) from the display panel 10. In this case, when the display panel 10 is viewed in the direction perpendicular to the upper surface (in the +z direction) of the display panel 10, a portion of the display panel 10 deformed into the shape corresponding to the filling layer 30 may be visible to the user.

Figure 5:
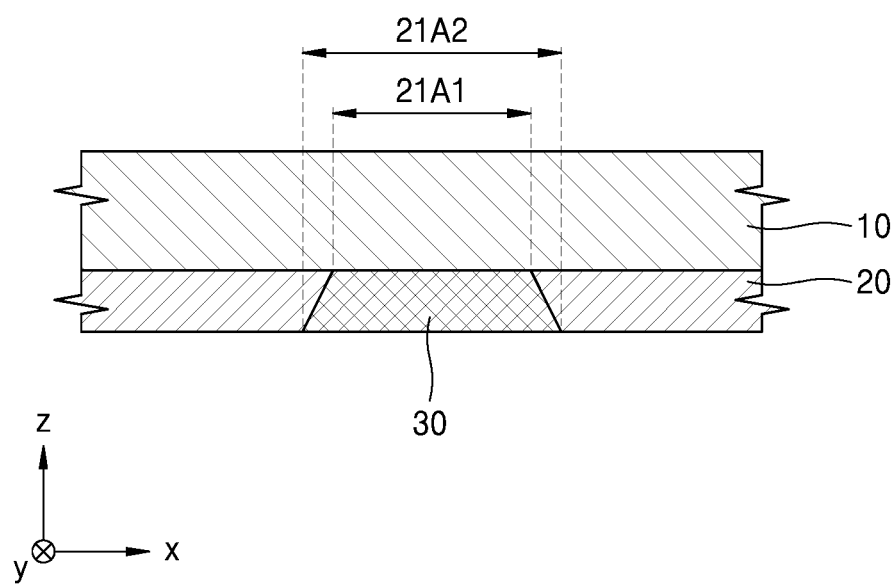
FIG. 5 is a cross-sectional view schematically illustrating a portion of a display apparatus according to another embodiment.

In order to prevent or substantially prevent this problem from occurring, as illustrated in FIG. 5, which is a cross-sectional view schematically illustrating a portion of a display apparatus according to another embodiment, a first cross-sectional area 21A1 of the opening 21 at the upper surface (in the +z direction) of the metal plate 20 in the direction of the display panel 10 may be smaller than a second cross-sectional area 21A2 of the opening 21 at the lower surface (in the −z direction) of the metal plate 20. The upper surface (in the +z direction) of the metal plate 20 faces the display panel 10. When the filling layer 30 has this structure, it may be possible to effectively prevent or substantially prevent the filling layer 30 from deviating from the opening 21 of the metal plate 20 to apply a stress to the display panel 10.

Figure 6:
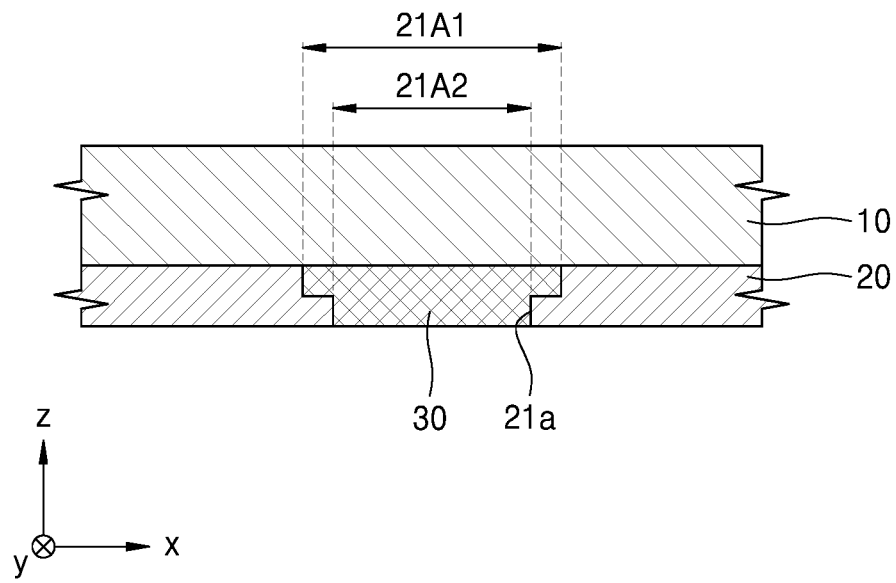
FIG. 6 is a cross-sectional view schematically illustrating a portion of a display apparatus according to another embodiment.

Moreover, the inner surface of the opening 21 of the metal plate 20 may include a bent (or angled) surface. FIG. 6 is a cross-sectional view schematically illustrating a portion of a display apparatus according to another embodiment. FIG. 6 illustrates that an inner surface 21a of the opening 21 of the metal plate 20 is bent twice. As the inner surface 21a of the opening 21 of the metal plate 20 includes a bent surface, the cross-sectional area of the filling layer 30 at a virtual plane parallel to the lower surface of the display panel 10 may vary depending on the position of the virtual plane.

FIG. 6 illustrates a case in which a first cross-sectional area 21A1 of the opening 21 at the upper surface (in the +z direction) of the metal plate 20 in the direction of the display panel 10 is larger than a second cross-sectional area 21A2 of the opening 21 at the lower surface (in the -z direction) of the metal plate 20. The upper surface (in the +z direction) of the metal plate 20 faces the display panel 10. That is, from the bottom (in the −z direction) of the metal plate 20 toward the display panel 10 (in the +z direction), the inner surface 21a of the opening 21 of the metal plate 20 may be primarily bent in a direction away from a central axis of the opening 21 and then secondarily bent in the direction toward the display panel 10. Accordingly, it may be possible to effectively prevent or substantially prevent the filling layer 30 from deviating from the opening 21 of the metal plate 20. That is, when the filling layer 30 deviates from the opening 21 of the metal plate 20, a portion of the display panel 10 corresponding to the opening 21 of the metal plate 20 may be bent into the opening 21 of the metal plate 20.

Figure 7:
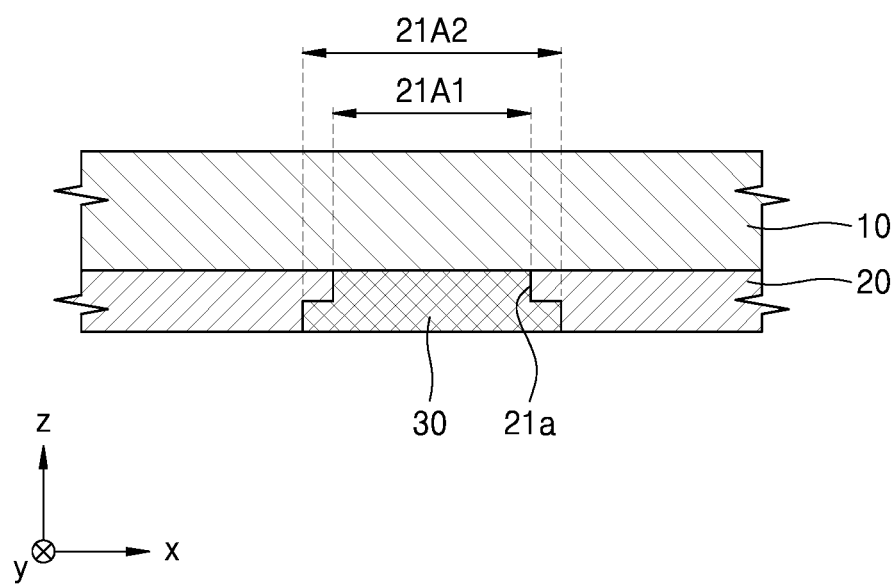
FIG. 7 is a cross-sectional view schematically illustrating a portion of a display apparatus according to another embodiment.

As illustrated in FIG. 7, which is a cross-sectional view schematically illustrating a portion of a display apparatus according to another embodiment, from the bottom (in the −z direction) of the metal plate 20 toward the display panel 10 (in the +z direction), the inner surface 21a of the opening 21 of the metal plate 20 may be primarily bent in the direction toward the central axis of the opening 21 and then secondarily bent in the direction toward the display panel 10. Accordingly, a first cross-sectional area 21A1 of the opening 21 at the upper surface (in the +z direction) of the metal plate 20 in the direction of the display panel 10 may be smaller than a second cross-sectional area 21A2 of the opening 21 at the lower surface (in the −z direction) of the metal plate 20. The upper surface (in the +z direction) of the metal plate 20 faces the display panel 10. When the filling layer 30 has this structure, it may be possible to effectively prevent or substantially prevent the filling layer 30 from deviating from the opening 21 of the metal plate 20 to apply a stress to the display panel 10.

Figure 8:
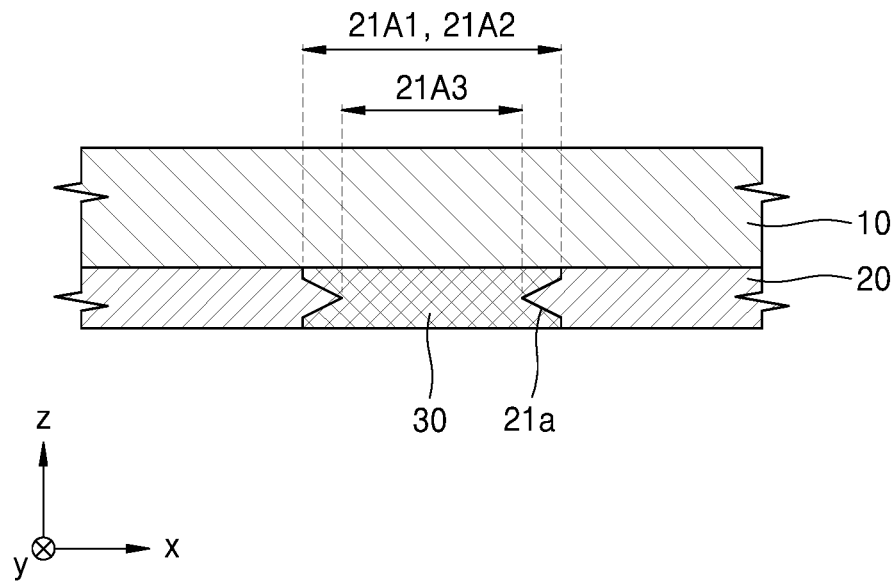
FIG. 8 is a cross-sectional view schematically illustrating a portion of a display apparatus according to another embodiment.

FIG. 8 is a cross-sectional view schematically illustrating a portion of a display apparatus according to another embodiment. In the display apparatus according to the present embodiment, the inner surface 21a of the opening 21 of the metal plate 20 may have a bent shape. Accordingly, as the inner surface 21a of the opening 21 of the metal plate 20 includes a bent surface, the cross-sectional area of the filling layer 30 at a virtual plane parallel to the lower surface of the display panel 10 may vary depending on the position of the virtual plane.

In the case of the display apparatus according to the present embodiment, a first cross-sectional area 21A1 of the opening 21 at the upper surface (in the +z direction) of the metal plate 20 in the direction of the display panel 10 and a second cross-sectional area 21A2 of the opening 21 at the lower surface (in the −z direction) of the metal plate 20 may be larger than a third cross-sectional area 21A3 of the opening 21 at the center (or a central portion) between the upper surface and the lower surface of the metal plate 20. The upper surface (in the +z direction) of the metal plate 20 faces the display panel 10. That is, the inner surface 21a of the opening 21 of the metal plate 20 may have a shape protruding toward the central axis of the opening 21. Accordingly, it may be possible to effectively prevent or substantially prevent the filling layer 30 filling the opening 21 from deviating from the opening 21 of the metal plate 20. Particularly, it may be possible to prevent or substantially prevent both the filling layer 30 from moving in the direction toward the display panel 10 and the filling layer 30 from moving in the opposite direction thereof.

Figure 9:
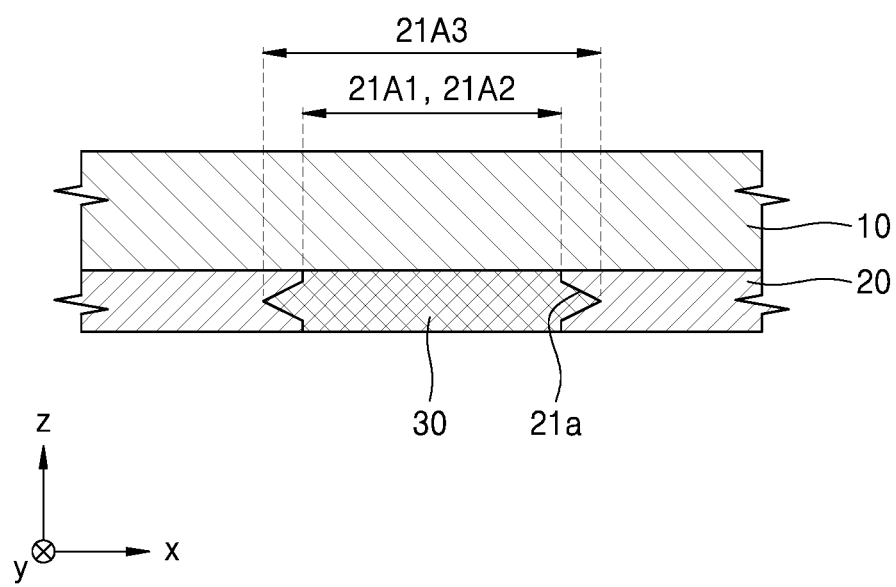
FIG. 9 is a cross-sectional view schematically illustrating a portion of a display apparatus according to another embodiment.

FIG. 8 illustrates a case in which the first cross-sectional area 21A1 of the opening 21 at the upper surface (in the +z direction) of the metal plate 20 in the direction of the display panel 10 and the second cross-sectional area 21A2 of the opening 21 at the lower surface (in the −z direction) of the metal plate 20 are larger than the third cross-sectional area 21A3 of the opening 21 at the center between the upper surface and the lower surface of the metal plate 20, where the upper surface (in the +z direction) of the metal plate 20 faces the display panel 10. However, embodiments of the present disclosure are not limited thereto. As illustrated in FIG. 9, which is a cross-sectional view schematically illustrating a portion of a display apparatus according to another embodiment, a first cross-sectional area 21A1 of the opening 21 at the upper surface (in the +z direction) of the metal plate 20 in the direction of the display panel 10 and a second cross-sectional area 21A2 of the opening 21 at the lower surface (in the −z direction) of the metal plate 20 may be smaller than a third cross-sectional area 21A3 of the opening 21 at the center between the upper surface and the lower surface of the metal plate 20. The upper surface (in the +z direction) of the metal plate 20 faces the display panel 10. That is, the inner surface 21a of the opening 21 of the metal plate 20 may have a shape protruding in a direction away from the central axis of the opening 21. Accordingly, it may be possible to effectively prevent or substantially prevent the filling layer 30 filling the opening 21 from deviating from the opening 21 of the metal plate 20. Particularly, it may be possible to prevent or substantially prevent both the filling layer 30 from moving in the direction toward the display panel 10 and the filling layer 30 from moving in the opposite direction thereof.

Figure 10:
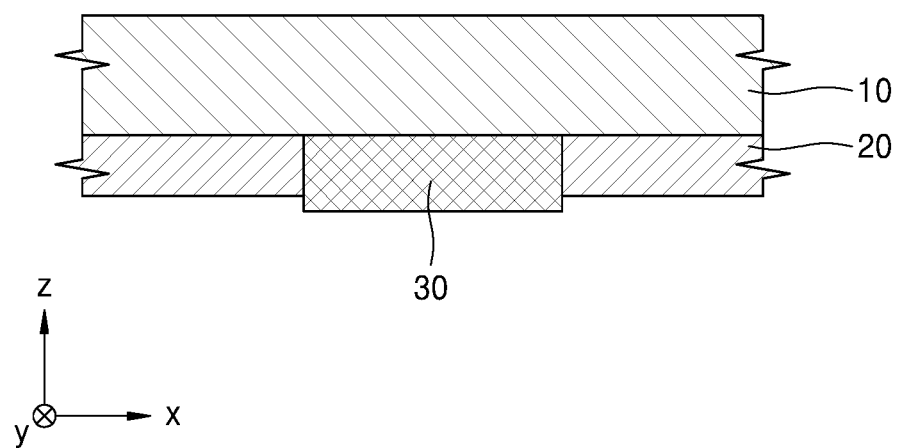
FIG. 10 is a cross-sectional view schematically illustrating a portion of a display apparatus according to another embodiment.
Figure 11:
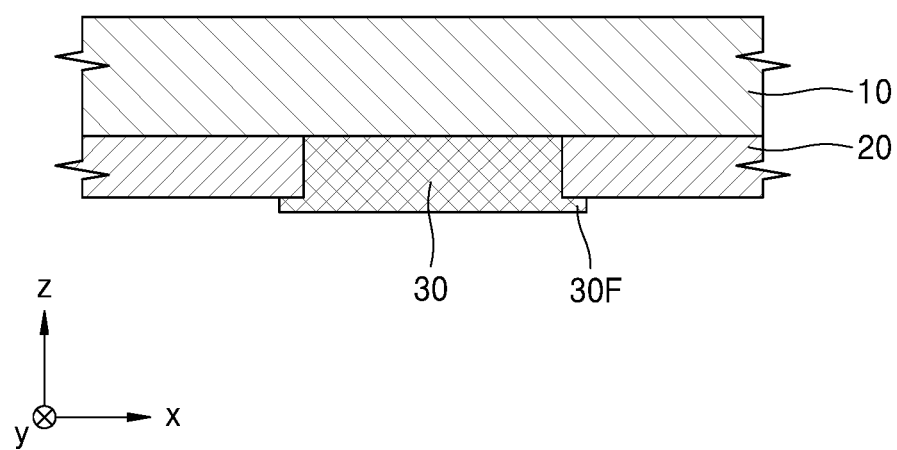
FIG. 11 is a cross-sectional view schematically illustrating a portion of a display apparatus according to another embodiment.

As illustrated in FIG. 10, which is a cross-sectional view schematically illustrating a portion of a display apparatus according to another embodiment, the filling layer 30 may have a shape protruding outside the lower surface of the metal plate 20 in the opposite direction (the −z direction) of the direction of the display panel 10. In addition, as illustrated in FIG. 11, which is a cross-sectional view schematically illustrating a portion of a display apparatus according to another embodiment, the filling layer 30 may include a flange portion 30F that protrudes outside the lower surface of the metal plate 20 in the opposite direction (the −z direction) of the direction of the display panel 10 such that the filling layer 30 may be located on the lower surface of the metal plate 20. When the filling layer 30 has this structure, it may be possible to effectively prevent or substantially prevent the filling layer 30 from deviating from the opening 21 of the metal plate 20 to apply a stress to the display panel 10.

Figure 12:
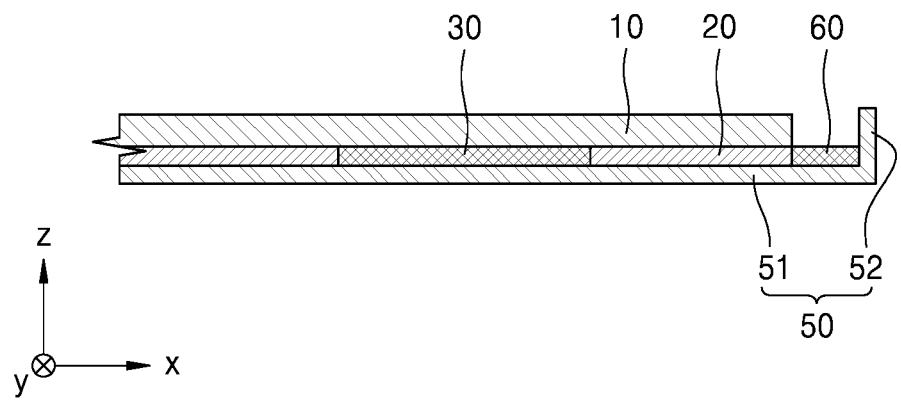
FIG. 12 is a cross-sectional view schematically illustrating a portion of a display apparatus according to another embodiment.

FIG. 12 is a cross-sectional view schematically illustrating a portion of a display apparatus according to another embodiment. The display apparatus according to the present embodiment may include a display panel 10, a metal plate 20 including an opening 21, a filling layer 30 filling the opening 21 of the metal plate 20, a bracket 50, and a shock mitigating member 60. Although FIG. 12 illustrates that the inner surface of the opening 21 of the metal plate 20 is substantially perpendicular to the lower surface (in the −z direction) of the display panel 10 as described above with reference to FIG. 2, embodiments of the present disclosure are not limited thereto. That is, the shapes of the inner surface of the opening 21 of the metal plate 20 and the filling layer 30 may be variously modified as described above with reference to FIGS. 4 to 9. This may also apply to the following embodiments and modifications thereof.

In an embodiment, the bracket 50 may include a main plate 51 and a side plate 52. The main plate 51 may be located under (in the −z direction) the metal plate 20 and may have a shape substantially parallel to the display panel 10. The side plate 52 may be connected to the main plate 51 to cover the side surface of the metal plate 20 and the side surface of the display panel 10. The bracket 50 may protect the display panel 10 or the like. However, when the shock mitigating member 60 is not included, the side surface of the display panel 10 may contact the side plate 52 of the bracket 50 and the display panel 10 may be damaged.

The side surface of the display panel 10 may contact the side plate 52 of the bracket 50 and the display panel 10 may be damaged even in the state illustrated in FIG. 12 illustrating that the outer surface of the display panel 10 coincides with the outer surface of the metal plate 20, and the display panel 10 may be damaged even in the case in which the outer surface of the display panel 10 protrudes outside the outer surface of the metal plate 20. However, when the outer surface of the metal plate 20 protrudes outside the outer surface of the display panel 10, because the metal plate 20 may contact the side plate 52 before the display panel 10 contacts the side plate 52, it may be possible to prevent or substantially prevent damage to the display panel 10. However, in this case, an interference may occur between the bracket 50 and the metal plate 20 having a large area in the process of seating the metal plate 20 in the bracket 50, and, thus, the metal plate 20 and/or the bracket 50 may be damaged. However, in the case of the display apparatus according to the present embodiment, the shock mitigating member 60 may be connected to the metal plate 20 to be located between the side surface of the metal plate 20 and the side plate 52. Accordingly, the side surface of the shock mitigating member 60 may contact the side plate 52 of the bracket 50 to prevent the display panel 10 from being damaged.

In an embodiment, in a manufacturing process, the shock mitigating member 60 may be concurrently (e.g., simultaneously) formed of a same material as the filling layer 30. Accordingly, the shock mitigating member 60 may include the same material as the filling layer 30. That is, in an embodiment, the shock mitigating member 60 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

Figure 13:
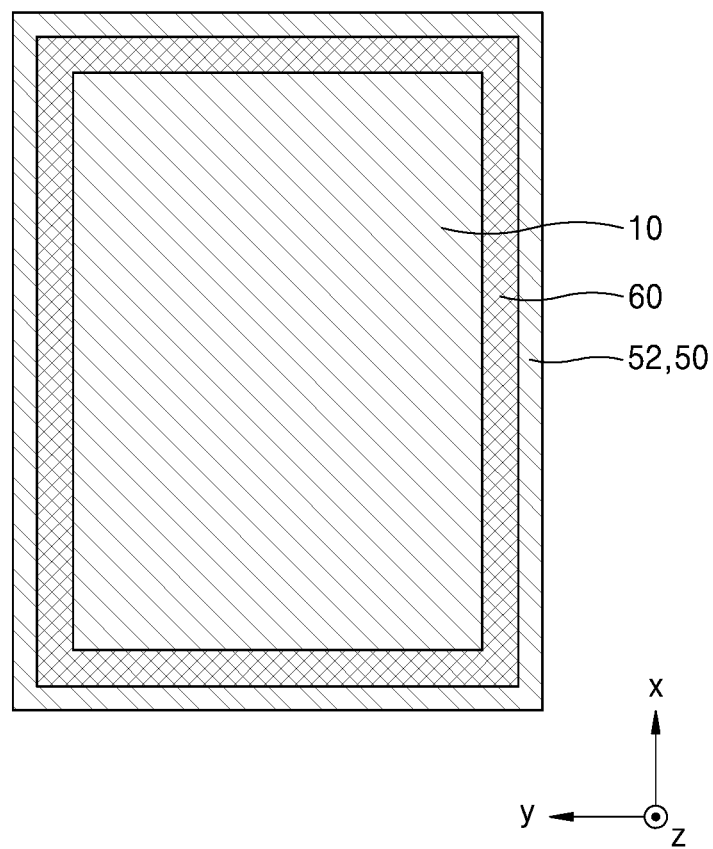
FIG. 13 is a plan view schematically illustrating a portion of the display apparatus of FIG. 12.

FIG. 13 is a plan view schematically illustrating a portion of the display apparatus of FIG. 12. As illustrated in FIG. 13, when viewed in a direction perpendicular to the upper surface of the display panel 10, the outer surface of the shock mitigating member 60 in the direction of the side plate 52 may be located outside the display panel 10. An outer surface of the shock mitigating member 60 faces the side plate 52. Accordingly, the display panel 10 may be effectively protected.

The shock mitigating member 60 may have any of various shapes. As illustrated in FIG. 12, the side surface of the shock mitigating member 60 in the direction of the metal plate 20 may have a shape substantially perpendicular to the upper surface of the main plate 51 of the bracket 50, and the side surface of the shock mitigating member 60 faces the metal plate 20. However, embodiments of the present disclosure are not limited thereto.

Figure 14:
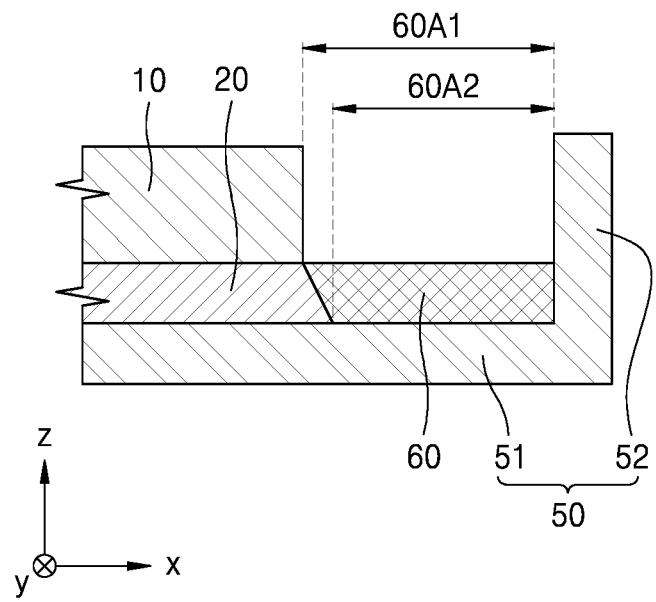
FIG. 14 is a cross-sectional view schematically illustrating a portion of a display apparatus according to another embodiment.

As illustrated in FIG. 14, which is a cross-sectional view schematically illustrating a portion of a display apparatus according to another embodiment, an area 60A1 of the upper surface of the shock mitigating member 60 in the direction (the +z direction) of the display panel 10 may be larger than an area 60A2 of the lower surface (in the –z direction) of the shock mitigating member 60.

Figure 15:
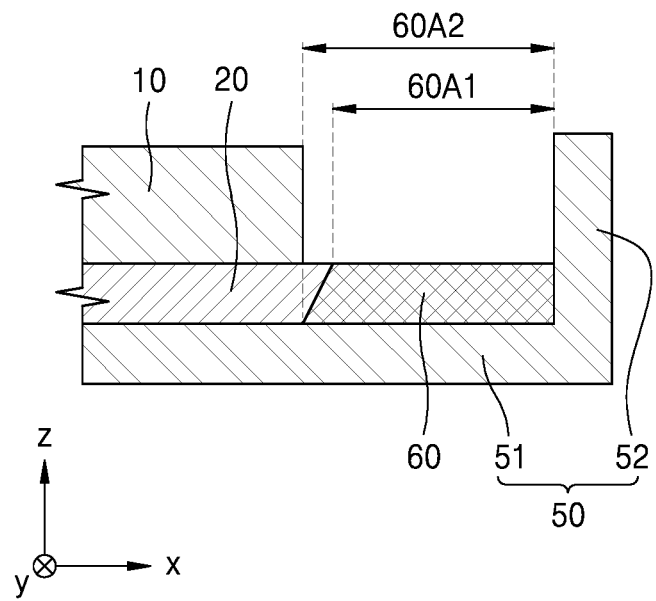
FIG. 15 is a cross-sectional view schematically illustrating a portion of a display apparatus according to another embodiment.

As illustrated in FIG. 15, which is a cross-sectional view schematically illustrating a portion of a display apparatus according to another embodiment, an area 60A1 of the upper surface of the shock mitigating member 60 in the direction (the +z direction) of the display panel 10 may be smaller than an area 60A2 of the lower surface (in the –z direction) of the shock mitigating member 60. When the shock mitigating member 60 has this structure, it may be possible to effectively prevent or substantially prevent the shock mitigating member 60 from deviating from the portion between the metal plate 20 and the side plate 52.

Figure 16:
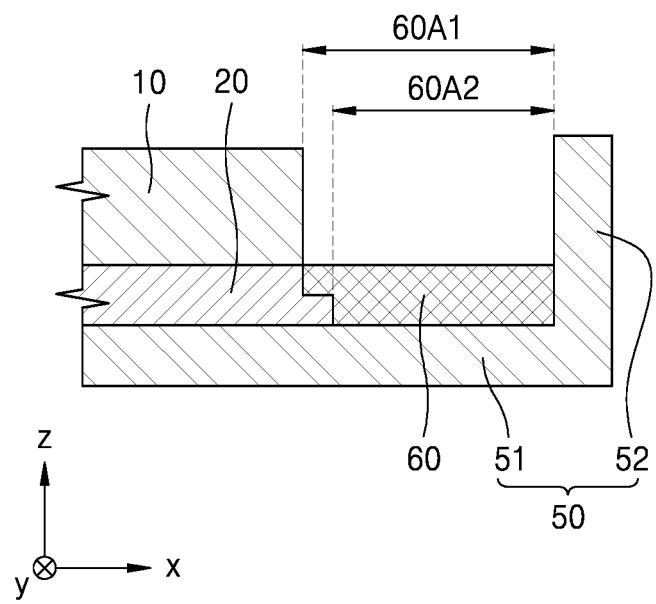
FIG. 16 is a cross-sectional view schematically illustrating a portion of a display apparatus according to another embodiment.

In an embodiment, the outer surface of the metal plate 20 may include a bent surface. FIG. 16 is a cross-sectional view schematically illustrating a portion of a display apparatus according to another embodiment. FIG. 16 illustrates that the outer surface of the metal plate 20 is bent twice. As the outer surface of the metal plate 20 includes a bent surface, the cross-sectional area of the shock mitigating member 60 at a virtual plane parallel to the lower surface of the display panel 10 may vary depending on the position of the virtual plane. FIG. 16 illustrates a case in which an area 60A1 of the upper surface of the shock mitigating member 60 in the direction (the +z direction) of the display panel 10 is larger than an area 60A2 of the lower surface (in the –z direction) of the shock mitigating member 60. That is, from the bottom (in the –z direction) of the metal plate 20 toward the display panel 10 (in the +z direction), the outer surface of the metal plate 20 may be primarily bent in the direction toward the inside of the metal plate 20 and then secondarily bent in the direction toward the display panel 10.

Figure 17:
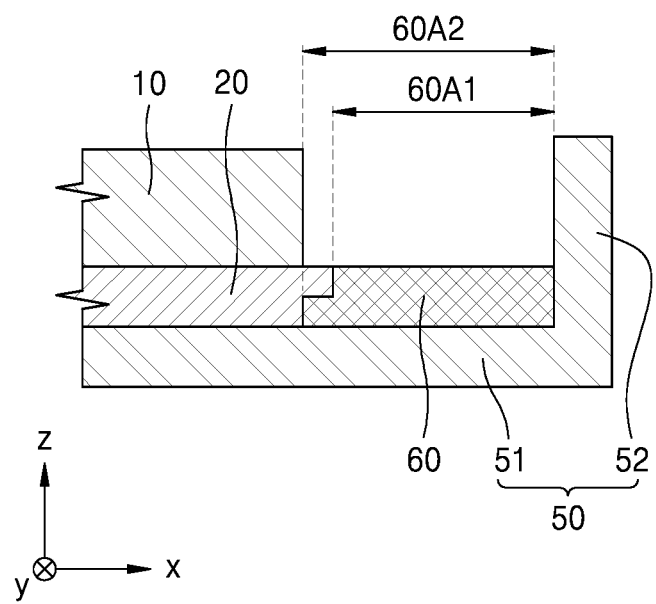
FIG. 17 is a cross-sectional view schematically illustrating a portion of a display apparatus according to another embodiment.

As illustrated in FIG. 17, which is a cross-sectional view schematically illustrating a portion of a display apparatus according to another embodiment, from the bottom (in the -z direction) of the metal plate 20 toward the display panel 10 (in the +z direction), the outer surface of the metal plate 20 may be primarily bent in the opposite direction to the direction toward the inside of the metal plate 20 and then secondarily bent in the direction toward the display panel 10. Accordingly, an area 60A1 of the upper surface of the shock mitigating member 60 in the direction (the +z direction) of the display panel 10 may be smaller than an area 60A2 of the lower surface (in the –z direction) of the shock mitigating member 60. Accordingly, it may be possible to effectively prevent or substantially prevent the shock mitigating member 60 from deviating from the portion between the metal plate 20 and the side plate 52.

Figure 18:
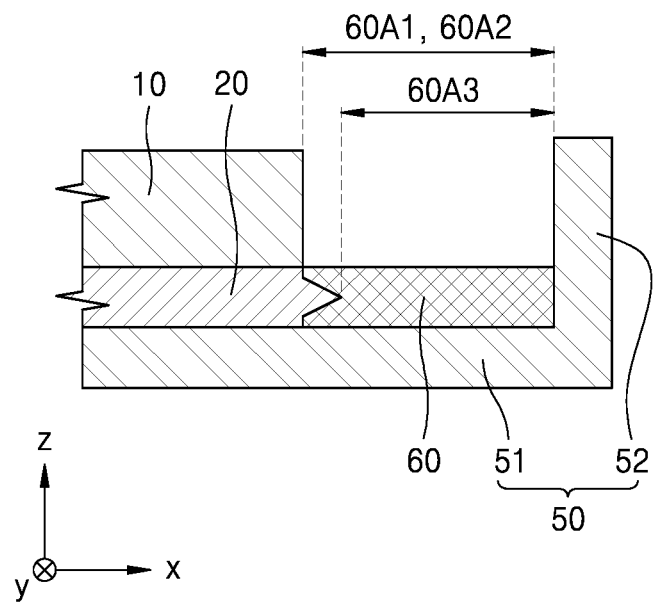
FIG. 18 is a cross-sectional view schematically illustrating a portion of a display apparatus according to another embodiment.

FIG. 18 is a cross-sectional view schematically illustrating a portion of a display apparatus according to another embodiment. In the display apparatus according to the present embodiment, the outer surface of the metal plate 20 may have a bent shape. Accordingly, as the outer surface of the metal plate 20 includes a bent surface, the cross-sectional area of the shock mitigating member 60 at a virtual plane parallel to the lower surface of the display panel 10 may vary depending on the position of the virtual plane.

In the case of the display apparatus according to the present embodiment, an area 60A1 of the upper surface of the shock mitigating member 60 in the direction (the +z direction) of the display panel 10 and an area 60A2 of the lower surface (in the –z direction) of the shock mitigating member 60 may be larger than a cross-sectional area 60A3 of the shock mitigating member 60 at the center between the upper surface and the lower surface of the shock mitigating member 60. That is, a central portion of the outer surface of the metal plate 20 may have a shape protruding outside the metal plate 20. Accordingly, it may be possible to effectively prevent or substantially prevent the shock mitigating member 60 located between the metal plate 20 and the side plate 52 from deviating from the space between the metal plate 20 and the side plate 52.

Figure 19:
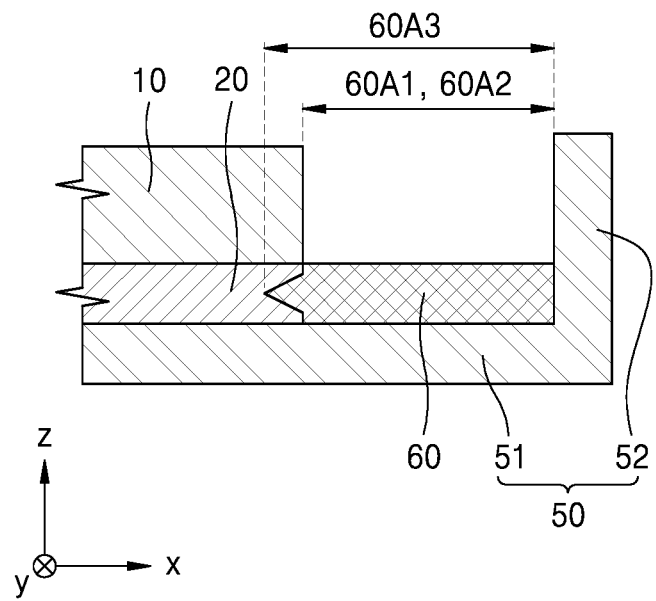
FIG. 19 is a cross-sectional view schematically illustrating a portion of a display apparatus according to another embodiment.

In FIG. 18, an area 60A1 of the upper surface of the shock mitigating member 60 in the direction (the +z direction) of the display panel 10 and an area 60A2 of the lower surface (in the –z direction) of the shock mitigating member 60 may be larger than a cross-sectional area 60A3 of the shock mitigating member 60 at the center between the upper surface and the lower surface of the shock mitigating member 60. However, embodiments of the present disclosure are not limited thereto. As illustrated in FIG. 19, which is a cross-sectional view schematically illustrating a portion of a display apparatus according to another embodiment, an area 60A1 of the upper surface of the shock mitigating member 60 in the direction (the +z direction) of the display panel 10 and an area 60A2 of the lower surface (in the –z direction) of the shock mitigating member 60 may be smaller than a cross-sectional area 60A3 of the shock mitigating member 60 at the center between the upper surface and the lower surface of the shock mitigating member 60. That is, a central portion of the outer surface of the metal plate 20 may have a shape indented into the metal plate 20. Accordingly, it may be possible to effectively prevent or substantially prevent the shock mitigating member 60 located between the metal plate 20 and the side plate 52 from deviating from the space between the metal plate 20 and the side plate 52.

Figure 20:
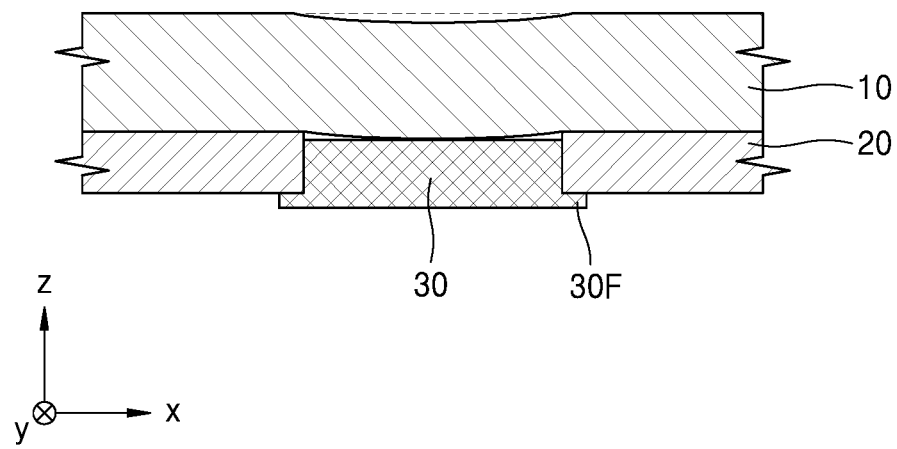
FIG. 20 is a cross-sectional view schematically illustrating a portion of a display apparatus according to a comparative example.

The volume of the filling layer 30 filling the opening 21 of the metal plate 20 described above may be unintentionally contracted in the process of forming the filling layer 30. FIG. 20 is a cross-sectional view schematically illustrating a portion of a display apparatus according to a comparative example, which illustrates that there is a step due to the contraction of the filling layer 30 between the upper surface of the filling layer 30 in the direction of the display panel 10 and the upper surface of the metal plate 20 in the direction of the display panel 10. The upper surface of the filling layer 30 faces the display panel 10. In this case, a portion of the display panel 10 corresponding to the opening 21 of the metal plate 20 may be bent into the opening 21 of the metal plate 20.

Figure 21:
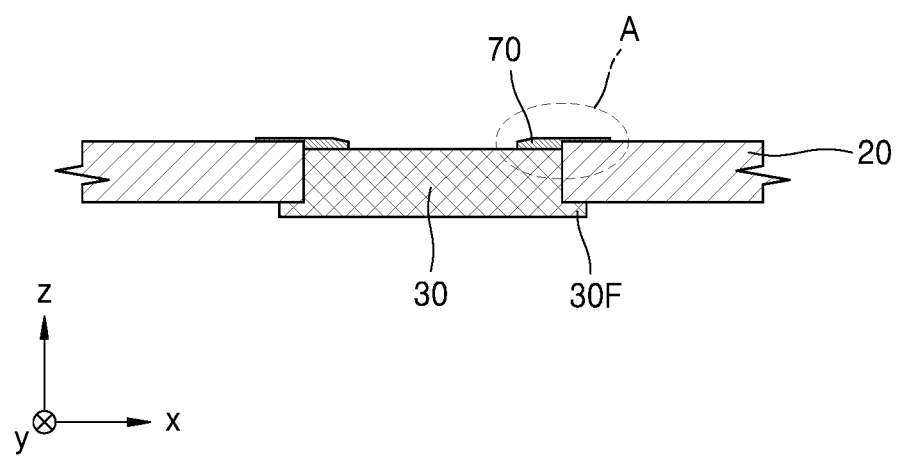
FIG. 21 is a cross-sectional view schematically illustrating a portion of a display apparatus according to another embodiment.

FIG. 21 is a cross-sectional view schematically illustrating a portion of a display apparatus according to another embodiment of the present disclosure. As illustrated in FIG. 21, the display apparatus according to the present embodiment may further include a step mitigating layer 70. The step mitigating layer 70 may be located on the upper surface of the metal plate 20 in the direction (the +z direction) of the display panel 10 to pass the boundary between the metal plate 20 and the filling layer 30. Also, a portion of the step mitigating layer 70 may be located on the filling layer 30. As for the step mitigating layer 70, a thickness thereof between the upper surface and the lower surface of a portion located on the filling layer 30 may be greater than a thickness thereof between the upper surface (in the +z direction) and the lower surface (in the −z direction) of a portion located on the metal plate 20. Accordingly, the step mitigating layer 70 may mitigate a step between the upper surface of the filling layer 30 in the direction of the display panel 10 and the upper surface of the metal plate 20 in the direction of the display panel 10. The upper surface of the filling layer 30 faces the display panel 10.

Figure 22:
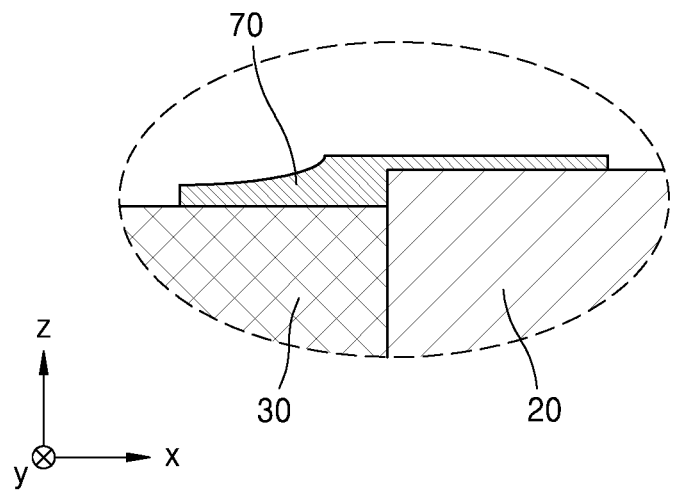
FIGS. 22 and 23 are enlarged cross-sectional views illustrating a region "A" of FIG. 21.
Figure 23:
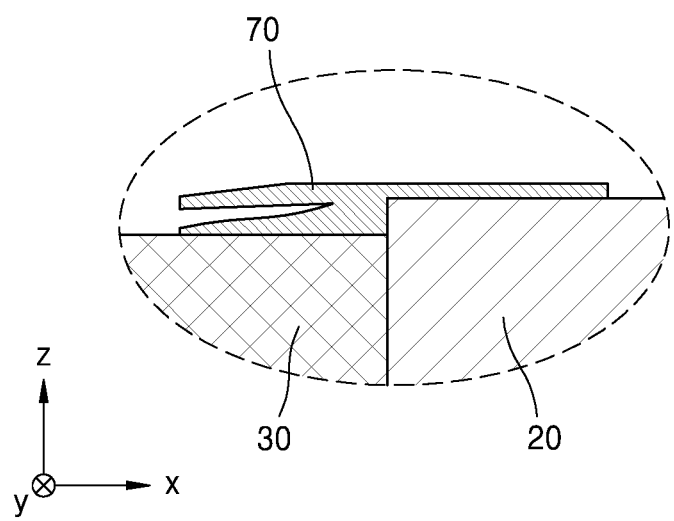

FIGS. 22 and 23 are enlarged cross-sectional views illustrating a region "A" of FIG. 21. As illustrated in FIG. 22, as for the step mitigating layer 70, initially, the thickness between the upper surface (in the +z direction) and the lower surface (in the −z direction) of a portion located on the metal plate 20 may be equal or similar to the thickness between the upper surface and the lower surface of a portion located on the filling layer 30. However, in an embodiment, as a pressure is applied to a portion of the step mitigating layer 70 located on the filling layer 30 in a process of manufacturing or in a process of using after the manufacture thereof, the thickness between the upper surface and the lower surface of the portion of the step mitigating layer 70 located on the filling layer 30 may be increased as illustrated in FIG. 23. In an embodiment, this is because the step mitigating layer 70 has a multilayer structure and the layers are separated from each other at the portion of the step mitigating layer 70 located on the filling layer 30. For example, the step mitigating layer 70 may include a thin metal layer and an invisible fingerprint (IF) coating layer.

When a fingerprint contacts a layer, an oil layer having the shape corresponding to the fingerprint may be transmitted from the fingerprint to the layer. The IF coating layer may prevent or substantially prevent the fingerprint from being viewed by the user, by spreading the oily layer having the shape corresponding to the fingerprint transmitted to the IF coating layer when contacting the fingerprint. Such an IF coating layer has a weak bonding force with a metal thin layer. Thus, when the IF coating layer and the thin metal layer are continuously located, the IF coating layer and the thin metal layer may be easily separated by an external stress.

The step mitigating layer 70 included in the display apparatus according to the present embodiment may include a thin metal layer and an invisible fingerprint (IF) coating layer. Accordingly, when a stress is applied to the step mitigating layer 70 through the display panel 10 in the space between the filling layer 30 and the display panel 10 formed by the contraction of the filling layer 30, the thin metal layer and the IF coating layer may be separated at the portion of the step mitigating layer 30 located on the filling layer 30 and thus the thickness between the upper surface and the lower surface of the step mitigating layer 70 may be increased. As a result, the step mitigating layer 70 may mitigate the step between the upper surface of the filling layer 30 in the direction of the display panel 10 and the upper surface of the metal plate 20 in the direction of the display panel 10. The upper surface of the filling layer 30 faces the display panel 10 and the upper surface of the metal plate 20 faces the display panel 10.

Figure 24:
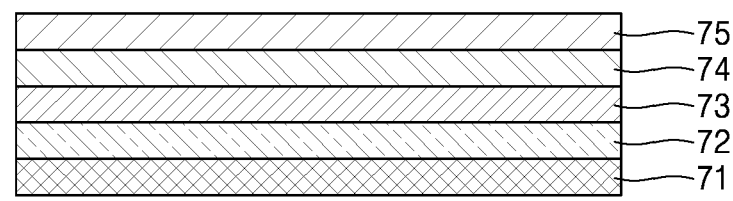
FIG. 24 is a cross-sectional view schematically illustrating a portion of a display apparatus according to another embodiment.
Figure 24:
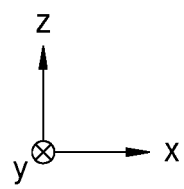

In an embodiment, the step mitigating layer 70 may further include an inorganic layer in addition to the thin metal layer and the IF coating layer. For example, as illustrated in FIG. 24, which is a cross-sectional view schematically illustrating a portion of a display apparatus according to another embodiment, the step mitigating layer 70 may have a five-layer structure. A bottom layer 71 thereof may be an inorganic layer and may include silicon oxide, silicon nitride, or silicon oxynitride. The inorganic layer may increase the bonding force between the step mitigating layer 70 and the metal plate 20. This is because an IF coating layer 72 has a low bonding force with the metal plate 20. The inorganic layer may be located on the upper surface of the metal plate 20 in the direction (the +z direction) of the display panel 10 to pass the boundary between the metal plate 20 and the filling layer 30. Also, the inorganic layer may be located on the filling layer 30.

The IF coating layer 72 may be located on the bottom layer 71 as the inorganic layer, and a thin metal layer 73 may be located on the IF coating layer 72. The thin metal layer 73 may include a metal, such as aluminum or silver. An inorganic layer 74 including silicon oxide, silicon nitride, or silicon oxynitride may be located on the thin metal layer 73, and a layer 75 including titanium oxide ($Ti_3O_5$) may be located on the inorganic layer 74. These various layers of the step mitigating layer 70 may be formed, for example, through a deposition method or the like.

Figure 25:
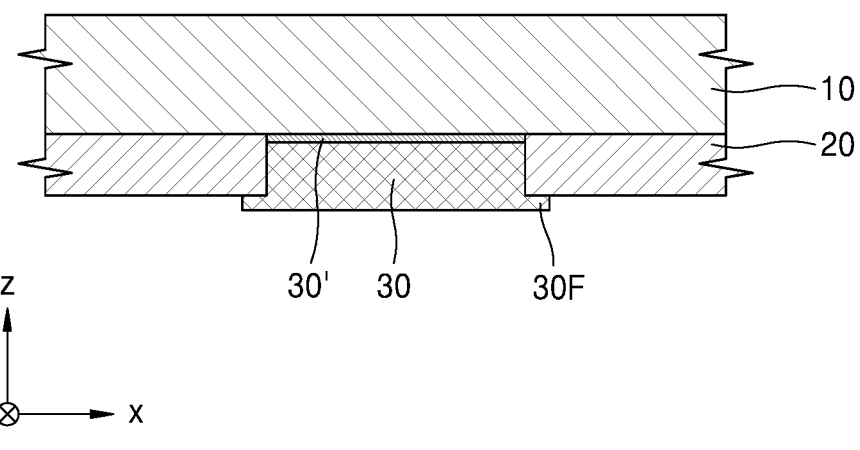
FIG. 25 is a cross-sectional view schematically illustrating a portion of a display apparatus according to another embodiment.
Figure 25:
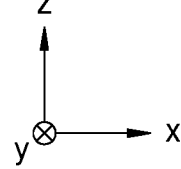

FIG. 25 is a cross-sectional view schematically illustrating a portion of a display apparatus according to another embodiment.

The display apparatus according to the present embodiment may not include the step mitigating layer 70. Instead, the display apparatus according to the present embodiment may include an additional filling layer 30'. As described above, the volume of the filling layer 30 filling the opening 21 of the metal plate 20 may be unintentionally contracted in the process of forming the filling layer 30. In this case, as illustrated in FIG. 25, the distance between the upper surface of the filling layer 30 in the direction (the +z direction) of the display panel 10 and the lower surface of the display panel 10 may be greater than the distance between the upper surface of the metal plate 20 in the direction (the +z direction) of the display panel 10 and the lower surface of the display panel 10.

The additional filling layer 30' may be located between the upper surface of the filling layer 30 and the lower surface of the display panel 10 to reduce the step between the upper surface of the filling layer 30 in the direction of the display panel 10 and the metal plate 20 and the upper surface of the metal plate 20 in the direction of the display panel 10. The upper surface of the filling layer 30 faces the display panel 10. In this case, the upper surface of the additional filling layer 30' in the direction of the display panel 10 may be located on the same plane as the upper surface of the metal plate 20 in the direction of the display panel 10. The upper surface of the additional filling layer 30' faces the display panel 10.

In an embodiment, the additional filling layer 30' may include a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. The additional filling layer 30' may be formed by locating a material for forming the same on the filling layer 30 and then leveling the upper surface thereof with a slit or the like. Moreover, the slit may also remove the material for the additional filling layer 30' remaining on the metal plate 20 in the process of forming the additional filling layer 30'.

According to one or more embodiments described above, a display apparatus capable of reducing a defect occurrence rate is provided. However, the scope of the present disclosure is not limited to the described aspects and effects.

It is to be understood that embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as set forth by the following claims.

What is claimed is:

1. A display apparatus comprising:
   a display panel;
   a metal plate comprising an opening and located under the display panel to contact a lower surface of the display panel to support the display panel; and
   a filling layer filling the opening and comprising a material different from a material of the metal plate.

2. The display apparatus of claim 1, wherein the filling layer comprises a polymer resin.

3. The display apparatus of claim 1, wherein the filling layer comprises a material configured to transmit electromagnetic waves.

4. The display apparatus of claim 1, further comprising a sensor located under the metal plate to correspond to the filling layer.

5. The display apparatus of claim 1, wherein an inner surface of the opening comprises a bent surface.

6. The display apparatus of claim 1, wherein a first cross-sectional area of the opening at an upper surface of the metal plate facing the display panel is larger than a second cross-sectional area of the opening at a lower surface of the metal plate.

7. The display apparatus of claim 1, wherein a first cross-sectional area of the opening at an upper surface of the metal plate facing the display panel is smaller than a second cross-sectional area of the opening at a lower surface of the metal plate.

8. The display apparatus of claim 1, wherein a first cross-sectional area of the opening at an upper surface of the metal plate facing the display panel and a second cross-sectional area of the opening at a lower surface of the metal plate are larger than a third cross-sectional area of the opening at a central portion between the upper surface and the lower surface of the metal plate.

9. The display apparatus of claim 1, wherein a first cross-sectional area of the opening at an upper surface of the metal plate facing the display panel and a second cross-sectional area of the opening at a lower surface of the metal plate are smaller than a third cross-sectional area of the opening at a central portion between the upper surface and the lower surface of the metal plate.

10. The display apparatus of claim 1, wherein the filling layer protrudes outside a lower surface of the metal plate in a direction away from the display panel.

11. The display apparatus of claim 10, wherein the filling layer comprises a flange portion located on the lower surface of the metal plate.

12. The display apparatus of claim 1, further comprising a bracket comprising a main plate located under the metal plate and a side plate connected to the main plate to cover a side surface of the metal plate and a side surface of the display panel.

13. The display apparatus of claim 12, further comprising a shock mitigating member connected to the metal plate and arranged between the side surface of the metal plate and the side plate.

14. The display apparatus of claim 13, wherein the shock mitigating member comprises a same material as that of the filling layer.

15. The display apparatus of claim 13, wherein an outer surface of the shock mitigating member in a direction toward the side plate is located outside the display panel when viewed in a direction perpendicular to an upper surface of the display panel.

16. The display apparatus of claim 13, wherein the side surface of the metal plate comprises a bent surface.

17. The display apparatus of claim 13, wherein an area of an upper surface of the shock mitigating member facing the display panel is larger than an area of a lower surface of the shock mitigating member.

18. The display apparatus of claim 13, wherein an area of an upper surface of the shock mitigating member facing the display panel is smaller than an area of a lower surface of the shock mitigating member.

19. The display apparatus of claim 13, wherein an area of an upper surface of the shock mitigating member facing the display panel and an area of a lower surface of the shock mitigating member are larger than a cross-sectional area of a cross-section parallel to the upper surface of the shock mitigating member at a central portion between the upper surface and the lower surface of the shock mitigating member.

20. The display apparatus of claim 13, wherein an area of an upper surface of the shock mitigating member facing the display panel and an area of a lower surface of the shock mitigating member are smaller than a cross-sectional area of a cross-section parallel to the upper surface of the shock mitigating member at a central portion between the upper surface and the lower surface of the shock mitigating member.

21. The display apparatus of claim 1, further comprising a step mitigating layer located on an upper surface of the metal plate facing the display panel to cover a boundary between the metal plate and the filling layer.

22. The display apparatus of claim 21, wherein the step mitigating layer comprises a plurality of layers.

23. The display apparatus of claim 21, wherein the step mitigating layer comprises a thin metal layer and an invisible fingerprint coating layer.

24. The display apparatus of claim 23, wherein the thin metal layer comprises aluminum.

25. The display apparatus of claim 21, wherein the step mitigating layer comprises an inorganic layer, an invisible fingerprint coating layer, and a thin metal layer.

26. The display apparatus of claim 25, wherein the inorganic layer is located on the upper surface of the metal plate facing the display panel to cover the boundary between the metal plate and the filling layer.

27. The display apparatus of claim 1, wherein a distance between an upper surface of the filling layer facing the display panel and a lower surface of the display panel is greater than a distance between an upper surface of the metal plate facing the display panel and the lower surface of the display panel, and the display apparatus further comprises an additional filling layer located between the upper surface of the filling layer and the lower surface of the display panel.

28. The display apparatus of claim 27, wherein an upper surface of the additional filling layer facing the display panel is located on a same plane as the upper surface of the metal plate facing the display panel.

* * * * *